(12) United States Patent
Ikeda

(10) Patent No.: US 11,989,442 B2
(45) Date of Patent: May 21, 2024

(54) SEMICONDUCTOR INTEGRATED CIRCUIT, RECEPTION DEVICE, MEMORY SYSTEM, AND SEMICONDUCTOR STORAGE DEVICE FOR REDUCING POWER CONSUMPTION OF EQUALIZER

(71) Applicant: Kioxia Corporation, Tokyo (JP)

(72) Inventor: Shinichi Ikeda, Fujisawa (JP)

(73) Assignee: Kioxia Corporation, Tokyo (JP)

( * ) Notice: Subject to any disclaimer, the term of this patent is extended or adjusted under 35 U.S.C. 154(b) by 229 days.

(21) Appl. No.: 17/644,435

(22) Filed: Dec. 15, 2021

(65) Prior Publication Data

US 2022/0413745 A1 Dec. 29, 2022

(30) Foreign Application Priority Data

Jun. 23, 2021 (JP) ................................ 2021-104418

(51) Int. Cl.
| | |
|---|---|
| *G11C 7/22* | (2006.01) |
| *G06F 3/06* | (2006.01) |
| *G11C 7/10* | (2006.01) |
| *G11C 16/04* | (2006.01) |
| *G11C 16/10* | (2006.01) |
| *G11C 16/32* | (2006.01) |

(Continued)

(52) U.S. Cl.
CPC .......... *G06F 3/0655* (2013.01); *G06F 3/0604* (2013.01); *G06F 3/0679* (2013.01); *G11C 7/1048* (2013.01); *G11C 7/1066* (2013.01); *G11C 7/1093* (2013.01); *G11C 7/222* (2013.01); *G11C 16/0483* (2013.01); *G11C 16/10* (2013.01); *G11C 16/32* (2013.01); *H03G 3/3036* (2013.01); *H04L 7/0079* (2013.01)

(58) Field of Classification Search
CPC ... G06F 3/0655; G06F 3/0604; G11C 7/1066; G11C 7/1093; G11C 16/0483; G11C 16/10; G11C 16/32; H03G 3/3036; H04L 7/0079
See application file for complete search history.

(56) References Cited

U.S. PATENT DOCUMENTS

| | | | |
|---|---|---|---|
| 8,649,445 B2 | 2/2014 | Cronie et al. | |
| 8,885,691 B1 * | 11/2014 | Ren | ............................ G05F 1/10 |
| | | | 375/319 |

(Continued)

FOREIGN PATENT DOCUMENTS

| | | |
|---|---|---|
| JP | 2014-022030 A | 2/2014 |
| JP | 2017-506048 A | 2/2017 |
| JP | 2018-530799 A | 10/2018 |

*Primary Examiner* — Mushfique Siddique
(74) *Attorney, Agent, or Firm* — Oblon, McClelland, Maier & Neustadt, L.L.P.

(57) ABSTRACT

A semiconductor integrated circuit has a reception circuit configured to receive a strobe signal of which a logic is intermittently switched in synchronization with a data signal, an output circuit configured to extract a low frequency component including at least a DC component of the strobe signal received by the reception circuit and to output a first signal, and a comparison circuit configured to compare a signal level of the first signal with a threshold level. The reception circuit is configured to change a boost amount of a high frequency component different from the low frequency component of the strobe signal based on a comparison result obtained by the comparison circuit.

20 Claims, 9 Drawing Sheets

(51) Int. Cl.
  *H03G 3/30*     (2006.01)
  *H04L 7/00*     (2006.01)

(56) References Cited

U.S. PATENT DOCUMENTS

| | | | |
|---|---|---|---|
| 10,320,591 B2 | 6/2019 | Giovannini et al. | |
| 2008/0304557 A1* | 12/2008 | Hollis | H04L 27/01 |
| | | | 375/231 |
| 2013/0107934 A1* | 5/2013 | Zhou | H04L 25/03885 |
| | | | 375/232 |
| 2014/0016404 A1 | 1/2014 | Kim et al. | |
| 2018/0175834 A1* | 6/2018 | Modi | H03K 7/08 |
| 2019/0296945 A1* | 9/2019 | Kitazawa | H04L 25/03057 |
| 2020/0295742 A1* | 9/2020 | Hagiwara | G06F 3/0679 |
| 2021/0080994 A1* | 3/2021 | Takada | H03L 7/0807 |

* cited by examiner

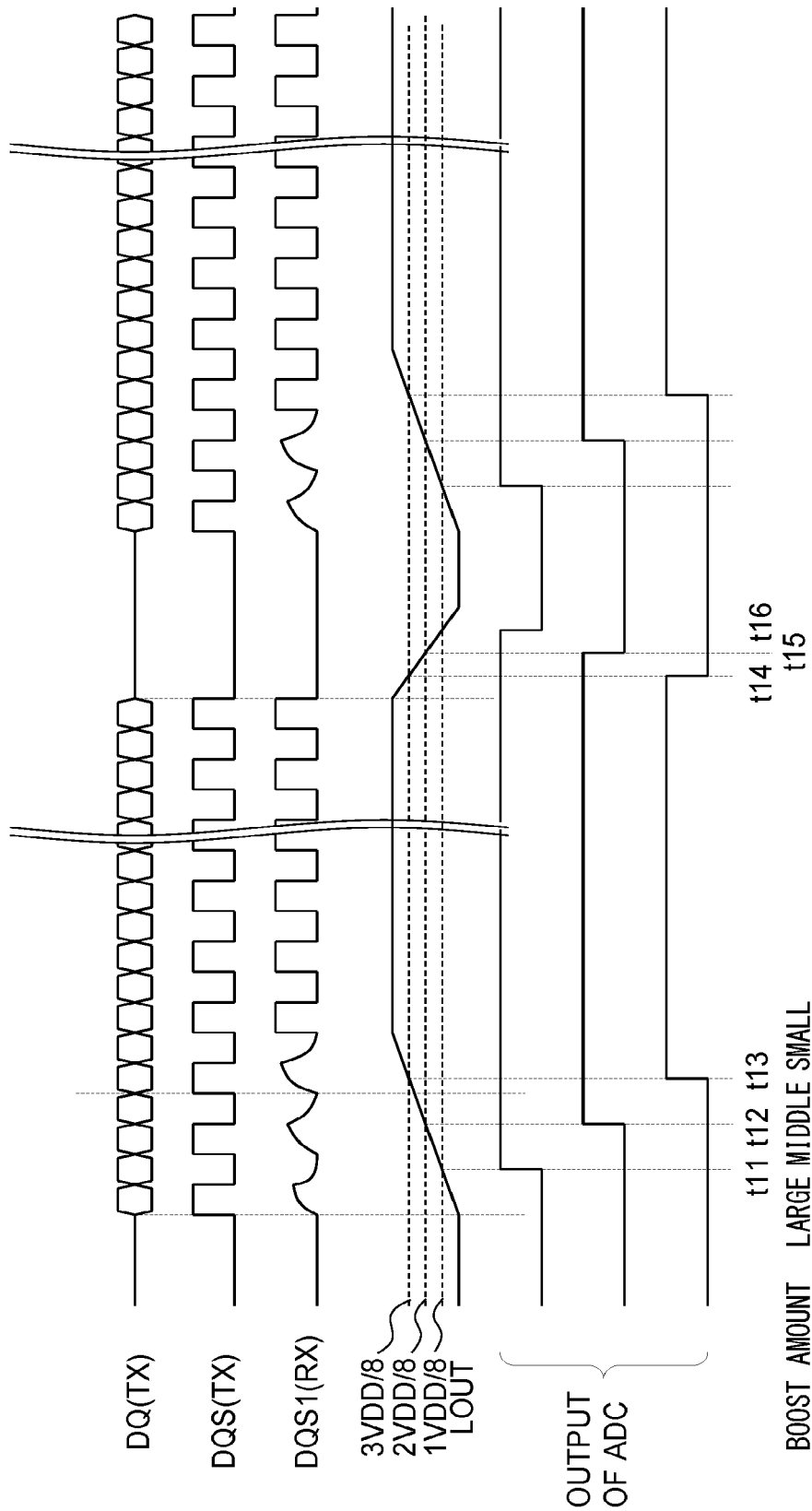

SEMICONDUCTOR INTEGRATED CIRCUIT, RECEPTION DEVICE, MEMORY SYSTEM, AND SEMICONDUCTOR STORAGE DEVICE FOR REDUCING POWER CONSUMPTION OF EQUALIZER

CROSS REFERENCE TO RELATED APPLICATIONS

This application is based upon and claims the benefit of priority from the prior Japanese Patent Application No. 2021-104418, filed on Jun. 23, 2021, the entire contents of which are incorporated herein by reference.

FIELD

One embodiment of the present invention relates to a semiconductor integrated circuit, a reception device, a memory system and a semiconductor storage device.

BACKGROUND

In a high speed signal path through which high speed signal transmission is performed, there is a possibility that intersymbol interference (ISI) occurs in the signal path. The ISI is a phenomenon in which a current signal level is affected by a signal level immediately before the current signal level. It is known that the ISI occurs in the case of a random signal of which an immediately preceding signal level is not determined, and does not occur in a signal, in which the immediately preceding signal level is uniquely determined, such as a clock signal.

In order to suppress the ISI, it is common to provide an equalizer on a reception side of the high speed signal path. By providing the equalizer, a high frequency component of a received signal can be boosted and shaped.

In parallel signal transmission such as an interface for controlling a memory, data and a strobe signal may be synchronized to be transmitted in many cases. The data and the strobe signal are transmitted and received intermittently. While transmitting the data, the strobe signal performs a clocking operation (or a toggling operation) in which a logic changes regularly according to the number of data (that is, the number of bits of the data to be transmitted). Therefore, the ISI does not inherently occur in the strobe signal while transmitting the data.

However, since the data and the strobe signal are transmitted and received intermittently, the strobe signal is affected by the ISI only during an initial period when the data starts to be transmitted. Therefore, in the related art, on a side on which the strobe signal is received, the strobe signal is input to the equalizer to suppress influence of the ISI. As described above, the strobe signal is affected by the ISI though it is merely the initial period when the transmission of the data is started, the high frequency component of the strobe signal is boosted over the entire data transmission period. Therefore, power consumption of the equalizer for a strobe signal may be greater than necessary.

BRIEF DESCRIPTION OF THE DRAWINGS

FIG. 9 is an operation timing diagram of an ADC and a DQS receiver of FIG. 8.

DETAILED DESCRIPTION

According to one embodiment, a semiconductor integrated circuit has a reception circuit configured to receive a strobe signal of which a logic is intermittently switched in synchronization with a data signal, an output circuit configured to extract a low frequency component including at least a DC component of the strobe signal received by the reception circuit and to output a first signal, and a comparison circuit configured to compare a signal level of the first signal with a threshold level. The reception circuit is configured to change a boost amount of a high frequency component different from the low frequency component of the strobe signal based on a comparison result obtained by the comparison circuit.

Hereinafter, embodiments of a semiconductor integrated circuit, a reception device, a memory system and a semiconductor storage device will be described with reference to the drawings. Hereinafter, configurations of the semiconductor integrated circuit, the reception device, the memory system, and the semiconductor storage device will be mainly described, but configurations and functions, which are not illustrated or described, may exist in the semiconductor integrated circuit, the reception device, the memory system, and the semiconductor storage device. The following description does not exclude the configurations and the functions not illustrated or described.

First Embodiment

Figure 1:
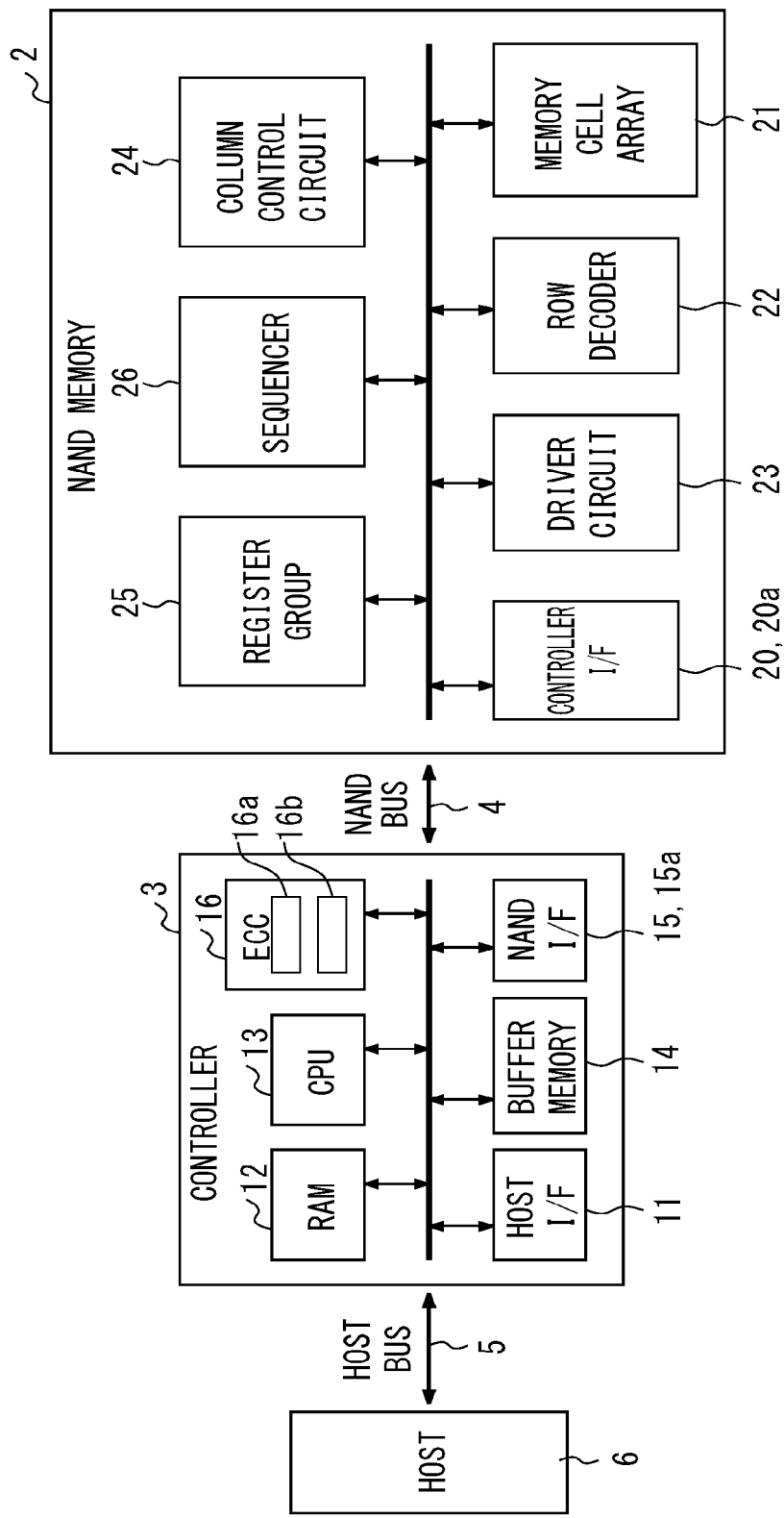
FIG. 1 is a block diagram illustrating a schematic configuration of a memory system according to an embodiment.

FIG. 1 is a block diagram illustrating a schematic configuration of a memory system 1 according to a first embodiment. The memory system 1 of FIG. 1 shows a configuration of an SSD using a NAND flash memory (hereinafter, simply referred to as a NAND memory) 2. The memory system 1 of FIG. 1 can also be applied to various systems other than the SSD, for example, an SD card, a universal serial bus (USB) memory, a universal flash storage (UFS) device, a multi media card (MMC), and the like. The memory system 1 of FIG. 1 also can be applied to a system using a non-volatile memory other than the NAND memory (for example, Magnetoresistive Random Access Memory (MRAM), Resistive Random Access Memory (ReRAM), Phase-change Random Access Memory (PRAM), and the like) or a system using a volatile memory (for example, Dynamic Random Access Memory (DRAM), Static Random Access Memory (SRAM), and the like).

The memory system 1 of FIG. 1 includes the NAND memory 2 and a controller 3. A specific configuration of the NAND memory 2 will be described later.

The controller 3 is connected to the NAND memory 2 via a NAND bus 4 and controls the NAND memory 2. The controller 3 can be connected to a host device (hereinafter, simply referred to as a host) 6 via a host bus 5. The controller 3 accesses the NAND memory 2 via the NAND bus 4 in response to an instruction received from the host 6 via the host bus 5. The host 6 is an electronic device such as a personal computer or a server. The host bus 5 is a bus that complies with interface standards such as PCIe™, UFS, and Ethernet™ The NAND bus 4 is a bus that complies with interface standards such as Toggle IF. That is, the controller 3 transmits and receives a signal to and from the host 6 and the NAND memory 2 according to a predetermined interface standard.

The controller 3 includes a host interface circuit (host I/F) 11, a built-in memory (RAM) 12, a processor (CPU) 13, a buffer memory 14, a NAND interface circuit (NAND I/F) 15, and an error checking and correcting (ECC) circuit 16.

The host interface circuit 11 is connected to the host 6 via the host bus 5, and transmits the instruction and the data, which are received from the host 6, to the CPU 13 and the buffer memory 14, respectively. The host interface circuit 11 transmits the data stored in the buffer memory 14 to the host 6 in response to the instruction of the CPU 13.

The CPU 13 controls an operation of the controller 3. For example, when the CPU 13 receives a write instruction from the host 6, the CPU 13 issues a write instruction to the NAND interface circuit 15 in response to the write instruction from the host 6. At the time of reading or erasing, the CPU 13 issues a read instruction or an erase instruction to the NAND interface circuit 15 in response to a received read instruction or a received erase instruction. The CPU 13 also executes various processing for managing the NAND memory 2. The various processing includes garbage collection, refreshing, and wear leveling. The operation of the controller 3 to be described below may be realized by the CPU 13 executing firmware, or may be realized by hardware.

The NAND interface circuit 15 is connected to the NAND memory 2 via the NAND bus 4 and controls communication with the NAND memory 2. The NAND interface circuit 15 transmits data to be written and a control signal to the NAND memory 2 based on the write instruction received from the CPU 13. The data to be written is transmitted as data DQ. The control signal includes a strobe signal DQS. The NAND interface circuit 15 makes a read request to the NAND memory 2 based on the read instruction received from the CPU 13, and receives data to be read and the control signal from the NAND memory 2. The data to be read is received as the data DQ. The control signal includes the strobe signal DQS. The buffer memory 14 temporarily stores the data to be written and the data to be read. The NAND interface circuit 15 receives the data DQ and the strobe signal DQS which are transmitted from the NAND memory 2 via the NAND bus 4, samples the data DQ with the strobe signal DQS, and then temporarily controls writing the sampled data as the data to be read to the buffer memory 14. The NAND interface circuit 15 synchronizes the data DQ corresponding to the data to be written with the strobe signal DQS, and transmits the synchronized data to the NAND memory 2 via the NAND bus 4 according to the instruction from the CPU 13. The detailed internal configuration and the operation of the NAND interface circuit 15 will be described later.

The RAM 12 is a semiconductor memory such as a DRAM or an SRAM, and is used as a work area of the CPU 13. The RAM 12 stores the firmware executed by the CPU 13 and various management information for managing the NAND memory 2.

The ECC circuit 16 performs processing related to error detection and error correction with respect to the data stored in the NAND memory 2. The ECC circuit 16 includes an encoder 16a and a decoder 16b. The encoder 16a generates an error correction code as the data is written, and adds the error correction code to the write data. The decoder 16b detects an error contained in the data read from the NAND memory 2 and corrects the detected error with the error correction code.

Next, the configuration of the NAND memory 2 will be described. As illustrated in FIG. 1, the NAND memory 2 includes a controller interface circuit (controller I/F) 20, a memory cell array 21, a row decoder 22, a driver circuit 23, a column control circuit 24, a register group 25, and a sequencer 26. The controller interface circuit (controller I/F) 20, the row decoder 22, the driver circuit 23, the column control circuit 24, the register group 25, and the sequencer 26 are peripheral circuits of the memory cell array 21.

The controller interface circuit 20 is connected to the controller 3 via the NAND bus 4 and controls communication with the controller 3. The controller interface circuit 20 receives the data DQ and the strobe signal DQS which are transmitted from the controller 3 via the NAND bus 4, and samples the data DQ with the strobe signal DQS and then controls writing the sampled data to the memory cell array 21. The controller interface circuit 20 synchronizes the data DQ corresponding to the data read from the memory cell array 21 with the strobe signal DQS and transmits the synchronized data to the controller 3 via the NAND bus 4 according to a read request from the controller 3. The detailed internal configuration and the operation of the controller interface circuit 20 will be described later.

The memory cell array 21 includes a plurality of blocks including a plurality of non-volatile memory cells associated with rows and columns. The configuration of the memory cell array 21 will be described in detail later. Reading and writing of the data with respect to the memory cell array 21 is controlled by the controller 3.

The row decoder 22 selects any of a plurality of the blocks, and further selects a row direction in the selected block. The driver circuit 23 supplies a voltage to the selected block via the row decoder 22.

When reading the data, the column control circuit 24 senses the data read from the memory cell array 21 and performs necessary computation. The necessary computed data is output to the controller 3 via the controller interface circuit 20. When writing the data, the column control circuit 24 transmits a signal corresponding to the data to be written, which is received from the controller 3, to the memory cell array 21.

The register group 25 includes an address register, and a command register. The address register stores the address received from the controller 3. The command register stores the command received from the controller 3.

The sequencer 26 controls the operation of the NAND memory 2 based on various information stored in the register group 25.

Next, a specific configuration of the memory cell array 21 will be described. The reading and writing of the data is performed on the memory cell array 21 in page units. A page size is, for example, 16 kbytes (131072 bits). The page size is not limited to this example and is arbitrary. Since the data cannot be overwritten to the NAND memory 2, the data needs to be erased in advance in order to be written. The data is erased in block units including multiple pages. In the present embodiment, a plurality of pages connected to a plurality of word lines are referred to as physical blocks.

Figure 2:
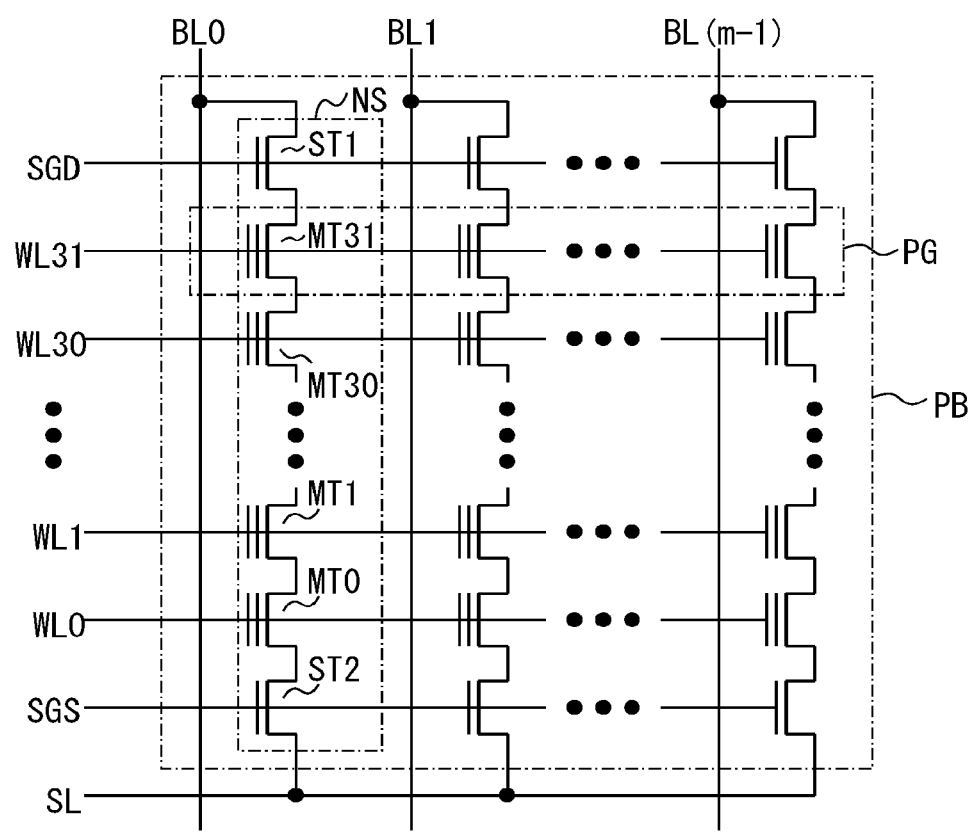
FIG. 2 is a circuit diagram illustrating an example of a circuit configuration of one physical block.

FIG. 2 is a circuit diagram illustrating an example of a specific configuration of one physical block PB. FIG. 2 illustrates a circuit configuration of the physical block PB to which 32 word lines WL0 to WL31 are connected. In FIG. 2, a page PG is configured by a plurality of memory cells connected to one word line WL and a plurality of bit lines BL, and the physical block PB is configured by a plurality of the page PG connected to a plurality of the word lines WL0 to WL31.

As illustrated in FIG. 2, for example, m (m is, for example, 16k) NAND strings NS to which a plurality of the memory cells are cascade-connected are arranged in a direction in which the word lines WL0 to WL31 extend (hereinafter, a word line direction). A selection transistor ST1 is connected to one end side of each NAND string NS, and a selection transistor ST2 is connected to the other end side of each NAND string NS. The corresponding bit line BL [0:m-1] is connected to a drain of each selection transistor ST1. A gate signal SGD which input to a gate of the selection transistor ST1 turns on or off all the selection transistors ST1 arranged in the word line direction. A gate signal SGS which input to a gate of the selection transistor ST2 turns on or off all the selection transistors ST2 arranged in the word line direction.

As described above, the NAND memory 2 and the controller 3 can transmit and receive the data DQ at high speed via the NAND bus 4. When the controller 3 writes the data corresponding to the data DQ to be transmitted to the memory cell array 21 of the NAND memory 2, the controller 3 transmits address information specifying a write target memory cell of the memory cell array 21 via the NAND bus 4. The controller 3 transmits the data DQ to be written to the write target memory cell and the strobe signal DQS synchronized with the data DQ to the NAND memory 2 via the NAND bus 4. When the controller 3 reads the data written and stored in the memory cell array 21, the controller 3 transmits the address information specifying a read target memory cell of the memory cell array 21 to the NAND memory 2 via the NAND bus 4. The NAND memory 2 transmits the data DQ corresponding to the read data and the strobe signal DQS synchronized with the data DQ to the controller 3 via the NAND bus 4, based on the address information.

In this way, the data DQ transmitted and received via the NAND bus 4 is synchronized with the strobe signal DQS, and both the data DQ and the strobe signal DQS are transmitted and received via the NAND bus 4. On the reception side, by sampling the received data DQ with the received strobe signal DQS, the data DQ can be synchronized on the transmission side and the reception side without separately transmitting and receiving the clock signal.

Figure 3:
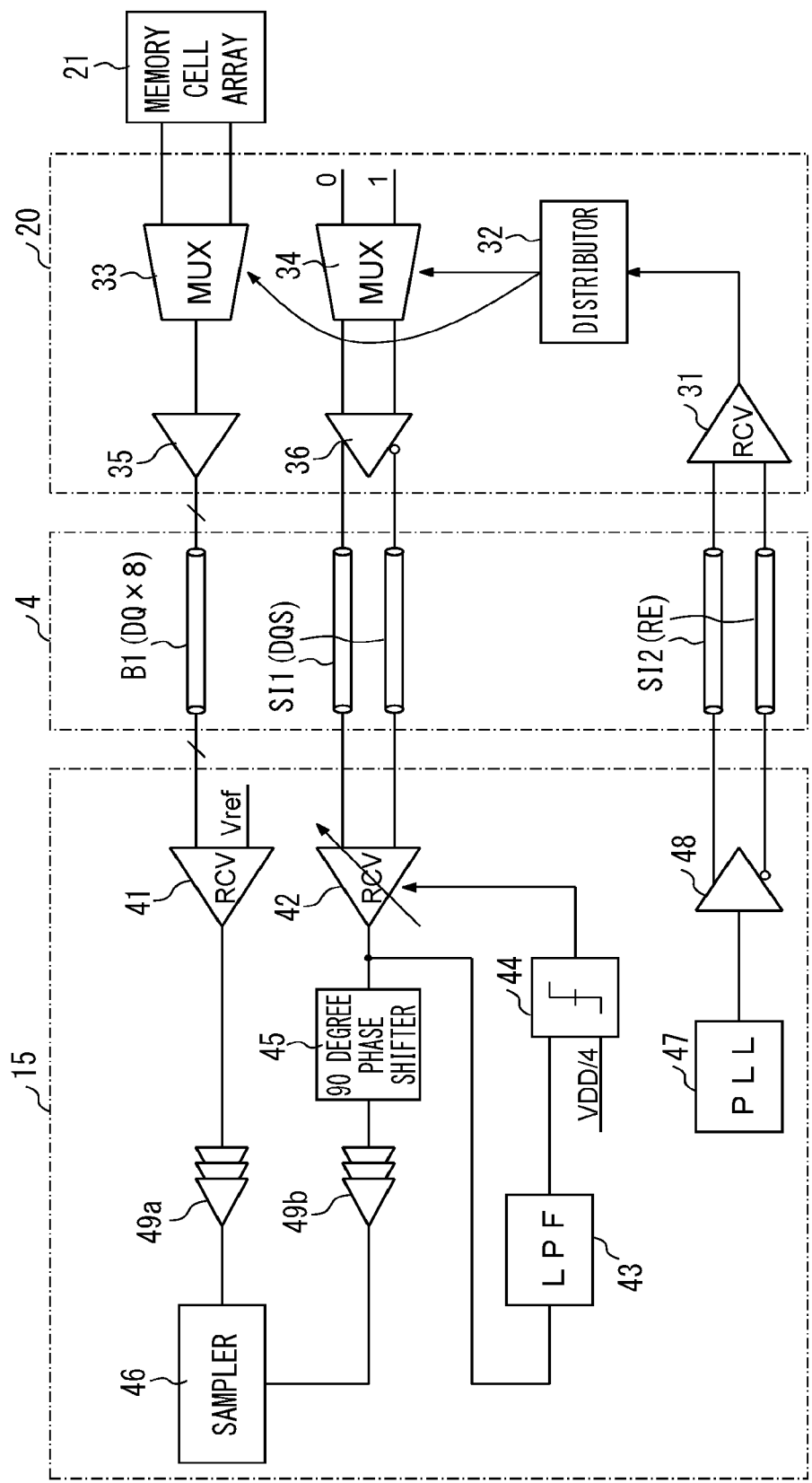
FIG. 3 is a block diagram illustrating an internal configuration of a controller interface circuit, a NAND bus, and a NAND interface circuit.

FIG. 3 is a block diagram illustrating a configuration related to data reading of the NAND interface circuit 15 of the controller 3, the NAND bus 4, and the controller interface circuit 20 of the NAND memory 2.

The NAND bus 4 includes a bus B1, two signal lines SI1, and two signal lines SI2. The bus B1 transmits and receives 8-bit data DQ in parallel. The two signal lines SI1 differentially transmit and receive the strobe signal DQS synchronized with the data DQ. The two signal lines SI2 differentially transmit and receive a reference signal RE used to generate the strobe signal DQS in the NAND memory 2.

At the time of the data reading, the 8-bit data DQ and the differential strobe signal DQS are transmitted from the NAND memory 2 to the controller 3 via the NAND bus 4. On the other hand, the differential reference signal RE is transmitted from the controller 3 to the NAND memory 2 via the NAND bus 4.

The controller interface circuit 20 of the NAND memory 2 includes a reference signal receiver 31 (RCV), a distributor 32, a DQ multiplexer (MUX) 33, a DQS multiplexer (MUX) 34, a DQ transmission buffer 35, and a DQS transmission buffer 36.

The reference receiver 31 receives the differential reference signal RE transmitted from the controller 3 via the NAND bus 4. The distributor 32 distributes the received reference signal RE to the DQ multiplexer 33 and the DQS multiplexer 34.

The DQ multiplexer 33 outputs the 8-bit data DQ read from the memory cell array 21 in synchronization with the reference signal RE distributed by the distributor 32. The DQS multiplexer 34 generates the differential strobe signal DQS based on the reference signal RE used by the DQ multiplexer 33 for the synchronization with the data DQ. A zero-level potential signal and a one-level potential signal are input to the DQS multiplexer 34, and the strobe signal DQS is generated by selecting and outputting one of the two potential signals.

The DQ transmission buffer 35 performs equalization processing of adjusting the frequency characteristic of the 8-bit data DQ output from the DQ multiplexer 33, and transmits the 8-bit data DQ obtained after the equalization processing to the NAND bus 4. The DQS transmission buffer 36 equalizes and converts the differential strobe signal DQS output from the DQS multiplexer 34 into a single phase, and transmits the equalized single-phase strobe signal DQS to the NAND bus 4.

The NAND interface circuit 15 of the controller 3 includes a DQ receiver (RCV) 41, a DQS receiver (reception circuit, RCV) 42, a low-pass filter (output circuit, LPF) 43, a comparator (comparison circuit) 44, a 90 degree phase shifter 45, a sampler 46, a PLL circuit 47, a reference signal transmission buffer 48, a buffer 49a, and a buffer 49b.

The DQ receiver 41 receives the 8-bit data DQ transmitted from the NAND memory 2 via the NAND bus 4. The 8-bit data DQ is the data DQ to be read. At this time, the DQ receiver 41 may perform processing of boosting the high frequency component of the received data DQ to suppress the influence of the ISI.

The DQS receiver 42 has an equalizer function that changes a boost amount of the high frequency component of the received strobe signal DQS based on the comparison result obtained by the comparator 44. The boost amount means a difference between a gain of a DC component and a peak gain of an AC component. In this way, unlike the DQ receiver 41, the DQS receiver 42 can change the boost amount of the high frequency component. Therefore, power consumption can be reduced by lowering the boost amount when not necessary. The DQS receiver 42 converts the differential strobe signal DQS into, for example, the single-phase strobe signal DQS and outputs the single-phase strobe signal DQS. The DQS receiver 42 may output the differential strobe signal DQS as it is.

The low-pass filter 43 (output circuit) extracts a low frequency component including at least a DC component contained in the strobe signal DQS output from the DQS receiver 42 to output a first signal.

The comparator 44 compares a signal level of the first signal with a threshold level. The threshold level is set to, for example, about one fourth of a power supply voltage VDD of the NAND interface circuit 15. The threshold level may be variably set to an arbitrary signal level.

The comparator 44 transmits, to the DQS receiver 42, a comparison result signal indicating whether the signal level of the first signal is equal to or lower than the threshold level or higher than the threshold level. The DQS receiver 42 changes the boost amount of the high frequency component different from the low frequency component of the strobe signal DQS based on the comparison result signal from the comparator 44. More specifically, the DQS receiver 42 adjusts a gain of the high frequency component without changing the gain of the DC component of the strobe signal DQS based on the comparison result signal. The comparator 44 determines that there is not the strobe signal DQS when the signal level of the first signal is equal to or lower than the threshold level, and determines that there is the strobe signal DQS when the signal level of the first signal is higher than the threshold level.

The 90 degree phase shifter 45 shifts a phase of an output signal (that is, the strobe signal DQS) of the DQS receiver 42 by 90 degrees. By providing the 90 degree phase shifter 45, a setup time and a hold time when sampling the data DQ with the strobe signal DQS are secured.

The sampler 46 samples the data DQ output from the DQ receiver 41 based on the strobe signal DQS output from the 90 degree phase shifter 45. The controller 3 handles the data DQ sampled by the sampler 46 as read data, and performs processing such as transmitting to the ECC circuit 16.

The data DQ output from the DQ receiver 41 may be input to the sampler 46 via the buffer 49a. Similarly, the strobe signal DQS output from the 90 degree phase shifter 45 may be input to the sampler 46 via the buffer 49b. The buffers 49a and 49b may have a function of buffering the data DQ and the strobe signal DQS, and may also have a function of delay adjustment. The buffers 49a and 49b have the same function as that of the distributor 32.

The PLL circuit 47 generates a clock signal corresponding to the reference signal RE of the strobe signal DQS. The PLL circuit 47 intermittently outputs the clock signal having a certain frequency in accordance with timing when the NAND memory 2 reads the data DQ from the memory cell array 21. The clock signal generated by the PLL circuit 47 is converted into the differential reference signal RE by the reference signal transmission buffer 48 and transmitted to the NAND memory 2 via the NAND bus 4.

Figure 4:
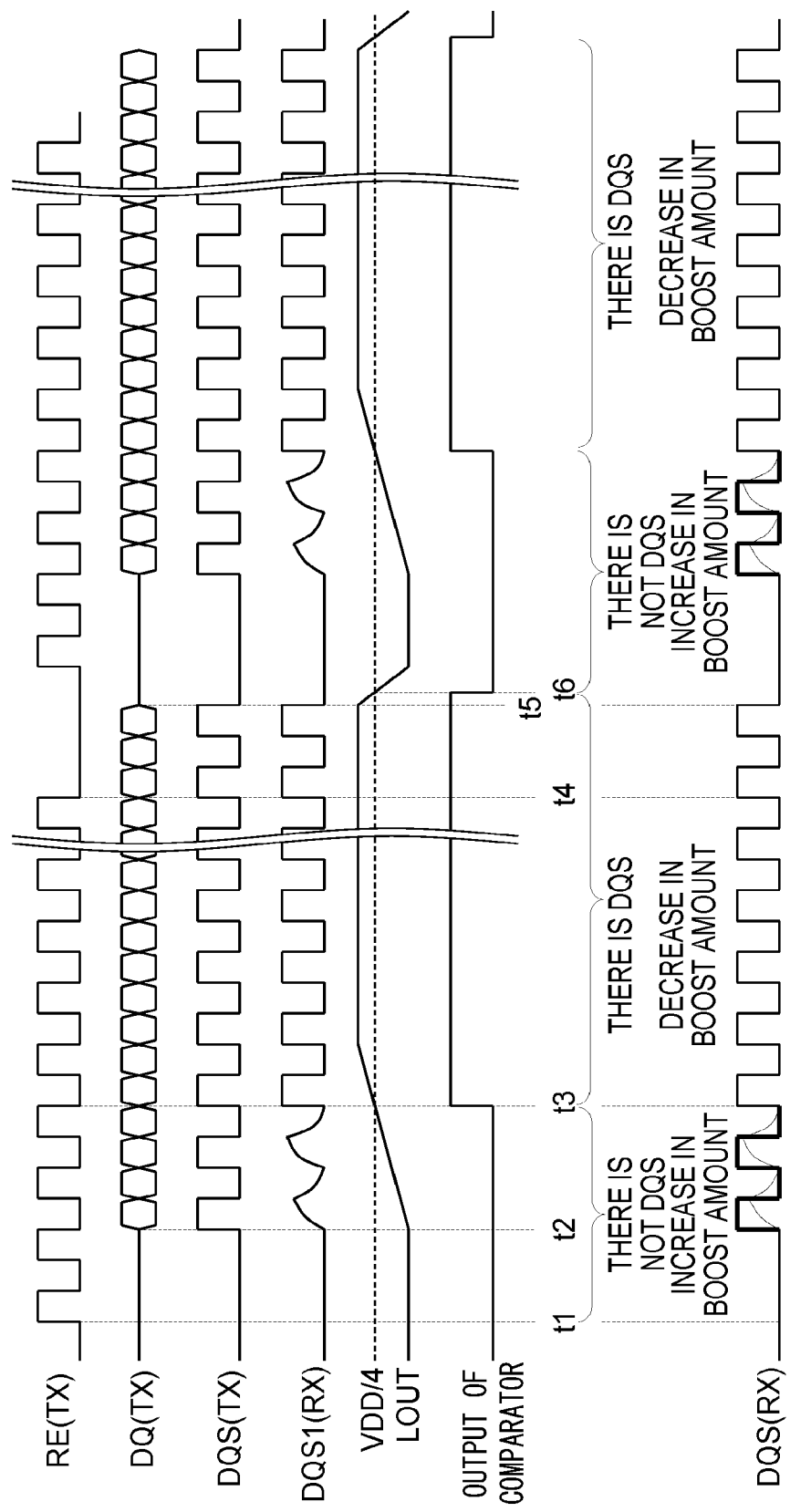
FIG. 4 is an operation timing diagram of each part of a controller interface circuit and a NAND interface circuit.

FIG. 4 is a timing diagram of an operation of each part of the controller interface circuit 20 and the NAND interface circuit 15 which are illustrated in FIG. 3. In a case where the controller 3 makes a data read request to the NAND memory 2, the PLL circuit 47 starts to output the clock signal at time t1. The reference signal RE is received by the reference receiver 31 of the controller interface circuit 20 of the NAND memory 2 via the NAND bus 4. The distributor 32 transmits the received reference signal RE to the DQ multiplexer 33 and the DQS multiplexer 34.

The NAND memory 2 reads the data DQ requested to be read from the memory cell array 21 in advance and temporarily stores the data DQ in a cache memory (not illustrated). After time t2, the cache memory synchronizes the read data DQ with the strobe signal DQS and transmits the synchronized data DQ to the controller 3 via the NAND bus 4, together with the strobe signal DQS. The NAND interface circuit 15 of the controller 3 receives the data DQ and the strobe signal DQS which are transmitted from the NAND memory 2 via the NAND bus 4. More specifically, the data DQ is received by the DQ receiver 41 and the strobe signal DQS is received by the DQS receiver 42.

As illustrated in FIG. 4, an immediately preceding signal logic of the strobe signal DQS is low level when the strobe signal DQS starts to be received by the DQS receiver 42 at time t2. Therefore, the ISI occurs during a particular period T (=time t3−time t2), and a waveform of the received strobe signal DQS becomes unstable as shown in a waveform DQS1 (RX) in the middle portion of FIG. 4. Therefore, in the NAND interface circuit 15 of the controller 3, the low-pass filter 43 extracts the low frequency component including at least the DC component contained in the received strobe signal DQS to output a first signal LOUT, and the comparator 44 compares a signal level of the first signal LOUT with a threshold level (for example, VDD/4) and the DQS receiver 42 boosts the high frequency component of the received strobe signal DQS during the period T=t3−t2 until time t3 when the signal level of the first signal LOUT matches with the threshold level. As a result, as shown in a waveform DQS (RX) at the bottom portion of FIG. 4, the DQS receiver 42 outputs the strobe signal DQS in which the high frequency component is boosted and the waveform is stable.

After time t3, the received strobe signal DQS is not affected by the ISI since the signal logic immediately before time t3 is not indefinite. Therefore, the DQS receiver 42 lowers the boost amount of the high frequency component of the received strobe signal DQS. Accordingly, power consumption of the DQS receiver 42 can be reduced.

After that, the controller 3 stops transmitting the clock signal from the PLL circuit 47 at time t4. Therefore, the NAND memory 2 stops transmitting the data DQ and the strobe signal DQS at time t5. Accordingly, the signal level of the first signal LOUT from the low-pass filter 43, which is input to the DQS receiver 42 of the controller 3, is equal to or lower than the threshold value. Based on the comparison result obtained by the comparator 44, the DQS receiver 42 determines that there is not DQS, and then increases the boost amount of the high frequency component for a case where the strobe signal DQS is input.

In FIGS. 3 and 4 described above, an example in which the boost amount of the high frequency component of the strobe signal DQS is changed on the controller 3 side in a case where the controller 3 reads the data DQ from the NAND memory 2 has been described. Even in a case where the controller 3 writes the data DQ to the NAND memory 2, the boost amount of the high frequency component of the strobe signal DQS may be changed on the NAND memory 2 side.

Figure 5:
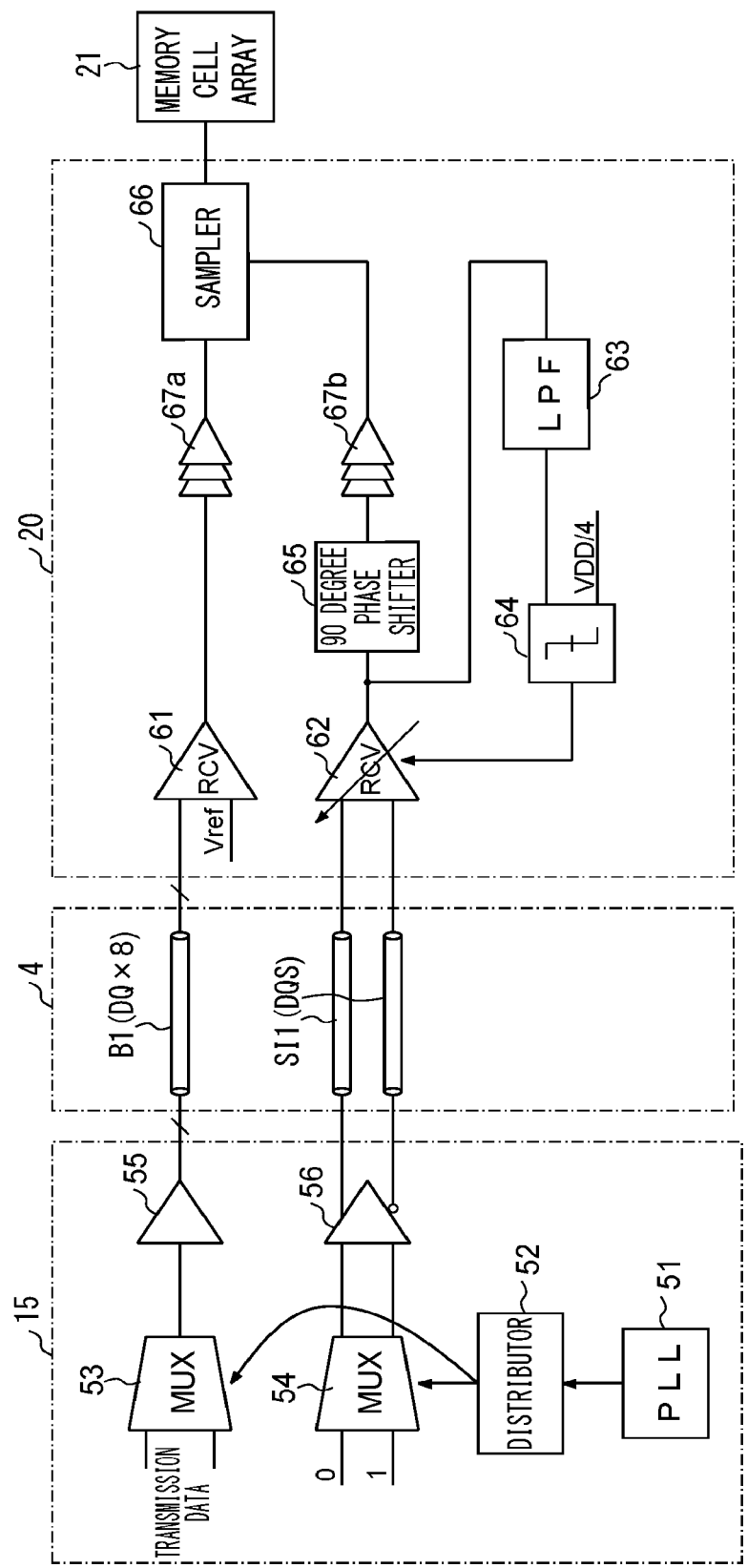
FIG. 5 is a block diagram illustrating an internal configuration of a controller interface circuit, a NAND bus, and a NAND interface circuit.

FIG. 5 is a block diagram illustrating an internal configuration related to data writing of the NAND interface circuit 15 of the controller 3, the NAND bus 4, and the controller interface circuit 20 of the NAND memory 2. The NAND bus 4 is shared at the data read time. However, in the data writing, the transmission direction of the data DQ and the strobe signal DQS is opposite to that of the data reading, and the data DQ and the strobe signal DQS are transmitted from the controller 3 to the NAND memory 2.

The NAND interface circuit 15 of the controller 3 includes a PLL circuit 51, a distributor 52, a DQ multiplexer 53, a DQS multiplexer 54, a DQ transmission buffer 55, and a DQS transmission buffer 56.

The PLL circuit 51 can share the PLL circuit 47 illustrated in FIG. 3, and intermittently outputs the clock signal corresponding to the strobe signal DQS and having a certain frequency in accordance with the timing of writing the data DQ. The distributor 52 distributes the clock signal to the DQ multiplexer 53 and the DQS multiplexer 54. A zero-level potential signal and a one-level potential signal are input to the DQS multiplexer 54, and the strobe signal DQS is generated by selecting and outputting one of the two potential signals.

The DQ multiplexer 53 outputs the data DQ to be written in synchronization with the clock signal. The DQS multiplexer 54 generates the differential strobe signal DQS based on the clock signal used by the DQ multiplexer 53 for the synchronization with the data DQ.

The DQ transmission buffer 55 equalizes the 8-bit data DQ output from the DQ multiplexer 53, and transmits the equalized 8-bit data DQ to the NAND bus 4. The DQS transmission buffer 56 equalizes and converts the differential strobe signal DQS output from the DQS multiplexer 54 into a single phase, and transmits the equalized single-phase strobe signal DQS to the NAND bus 4.

The controller interface circuit 20 of the NAND memory 2 includes a DQ receiver 61, a DQS receiver 62, a low-pass filter 63, a comparator 64, a 90 degree phase shifter 65, a sampler 66, a buffer 67a, and a buffer 67b. The buffers 67a and 67b have the same function as that of the distributor 52.

The DQ receiver 61 receives the 8-bit data DQ transmitted from the controller 3 via the NAND bus 4. The 8-bit data DQ is the data DQ to be written. At this time, the DQ receiver 61 may perform processing of boosting the high frequency component of the received data DQ to suppress the influence of the ISI.

The DQS receiver 62 has an equalizer function of changing the boost amount of the high frequency component of the received strobe signal DQS based on the comparison result obtained by the comparator 64. In this way, unlike the DQ receiver 61, the DQS receiver 62 can change the boost amount of the high frequency component. Therefore, power consumption can be reduced by lowering the boost amount when not necessary. The DQS receiver 62 converts the differential strobe signal DQS into the single-phase strobe signal DQS and outputs the single-phase strobe signal DQS. The DQS receiver 62 may output the differential strobe signal DQS as it is.

The low-pass filter 63 (output circuit) extracts a low frequency component including at least a DC component contained in the strobe signal DQS output from the DQS receiver 62 to output a first signal.

The comparator 64 compares a signal level of the first signal with a threshold level. For example, in a case where amplitude of the received signal is VDD/2, the threshold level is set to about one fourth of a power supply voltage VDD of the controller interface circuit 20. The threshold level may be variably set to an arbitrary signal level.

The comparator 64 transmits, to the DQS receiver 62, a comparison result signal indicating whether the signal level of the first signal is equal to or lower than the threshold level or higher than the threshold level. The DQS receiver 62 changes the boost amount of the high frequency component of the strobe signal DQS based on the comparison result signal obtained by the comparator 64. More specifically, the DQS receiver 62 adjusts a gain of the high frequency component without changing the gain of the DC component of the strobe signal DQS based on the comparison result signal.

The 90 degree phase shifter 65 shifts a phase of an output signal (that is, the strobe signal DQS) of the DQS receiver 62 by 90 degrees. The sampler 66 samples the data DQ output from the DQ receiver 61 based on the strobe signal DQS output from the 90 degree phase shifter 65. The NAND memory 2 handles the data DQ sampled by the sampler 66 as write data, and performs processing of transmitting the data DQ to the peripheral circuit or the memory cell array 21.

The data DQ output from the DQ receiver 61 may be input to the sampler 66 via the buffer 67a. Similarly, the strobe signal DQS output from the 90 degree phase shifter 65 may be input to the sampler 66 via the buffer 67b. The buffers 67a and 67b may have a function of buffering the data DQ and the strobe signal DQS, and may also have a function of delay adjustment.

Even at the time of the data writing illustrated in FIG. 5, the NAND interface circuit 15 and the controller interface circuit 20 basically operate at the same timing as in FIG. 4, although the transmission directions are different.

As described above, in the first embodiment, at the time of the data reading, the first signal is generated by the low-pass filter 43 based on the strobe signal DQS received by the DQS receiver 42 of the controller 3, and in a case where the signal level of the first signal is equal to or lower than the threshold level, it is determined that there is not the DQS, and the boost amount of the high frequency component of the DQS receiver 42 is increased. On the other hand, in a case where the signal level of the first signal is higher than the threshold level, it is determined that there is the DQS, and the boost amount of the high frequency component of the DQS receiver 42 is decreased. Accordingly, the boost amount of the high frequency component of the DQS receiver 42 can be increased during a certain period when the strobe signal DQS starts to be received on the controller 3 side, and then the boost amount of the high frequency component of the DQS receiver 42 can be decreased. Therefore, the power consumption of the DQS receiver 42 can be reduced.

Similarly, at the time of the data writing, the first signal is generated by the low-pass filter 63 based on the strobe signal DQS received by the DQS receiver 62 of the NAND memory 2, and in a case where the signal level of the first signal is equal to or lower than the threshold level, it is determined that there is not the DQS, and the boost amount of the high frequency component of the DQS receiver 62 is increased. On the other hand, in a case where the signal level of the first signal is higher than the threshold level, it is determined that there is the DQS, and the boost amount of the high frequency component of the DQS receiver 62 is decreased. Accordingly, the boost amount of the high frequency component of the DQS receiver 62 can be increased during a certain period when the strobe signal DQS starts to be received on the NAND memory 2 side, and then the boost amount of the high frequency component of the DQS receiver 42 can be decreased. Therefore, power consumption of the DQS receiver 62 can be reduced.

As described above, according to the first embodiment, in the period during the strobe signal DQS performs intermittent operation, the boost amount of the high frequency component of the strobe signal DQS is increased only within a particular period T after the logic of the strobe signal DQS starts to change, and then the boost amount of the high frequency component of the DQS receiver 42 is decreased. Therefore, the power consumption of the DQS receivers 42 and 62 can be reduced without causing the ISI of the strobe signal DQS.

Second Embodiment

The memory system 1 according to a second embodiment embodies an internal configuration of at least one of the DQS receiver 42 of the NAND interface circuit 15 and the DQS receiver 62 of the controller interface circuit 20.

Figure 6:
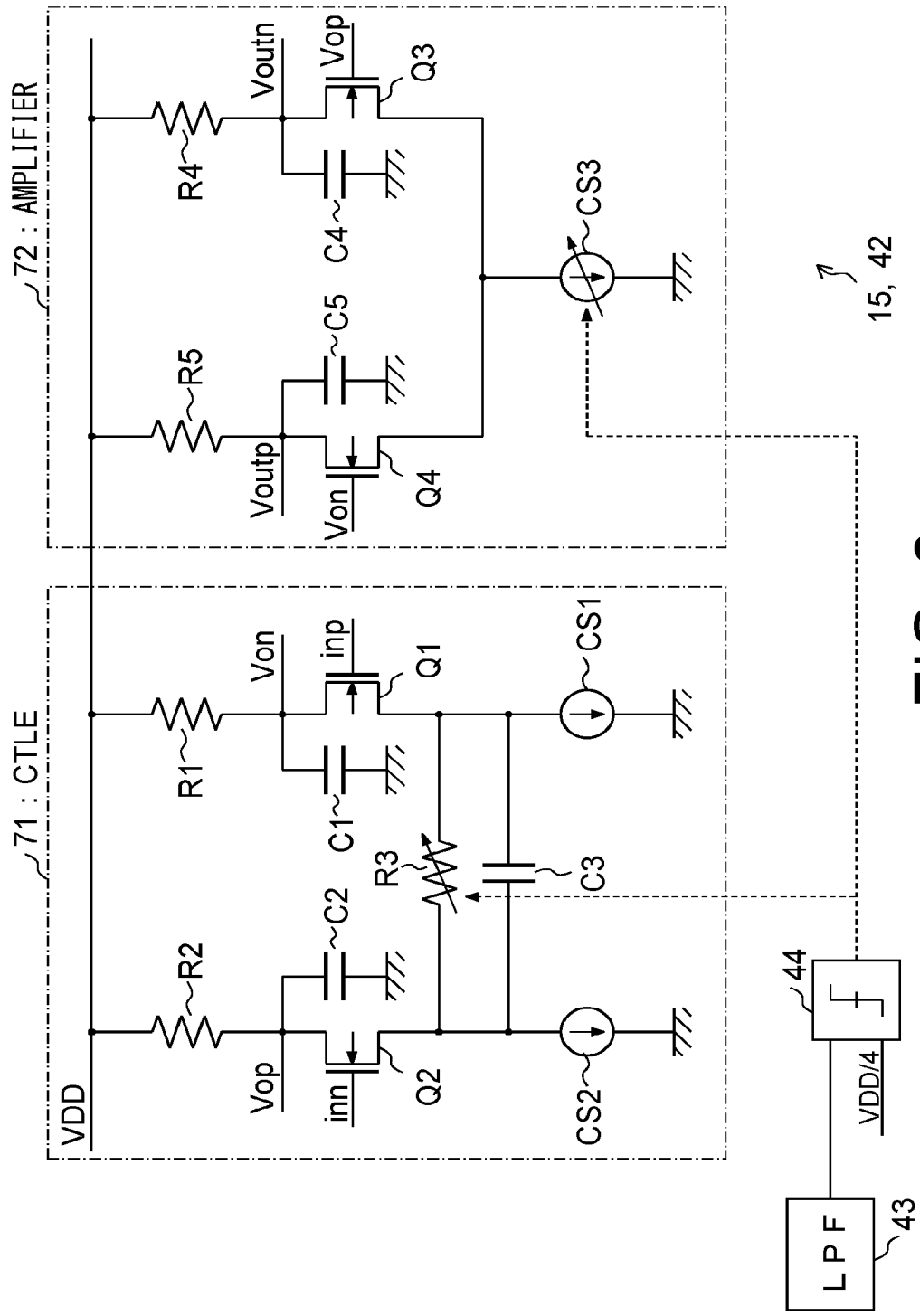
FIG. 6 is a circuit diagram illustrating an example of an internal configuration of a DQS receiver according to a second embodiment.

FIG. 6 is a circuit diagram illustrating an example of the internal configuration of the DQS receiver 42 according to the second embodiment. The DQS receiver 42 of FIG. 6 includes a continuous time linear equalizer circuit (CTLE) 71 and an amplifier 72. FIG. 6 illustrates the internal configuration of the DQS receiver 42, but the same internal configuration can be adopted for the DQS receiver 62.

The CTLE 71 controls the gain of the high frequency component of the strobe signal DQS and the gain of the DC component of the strobe signal DQS in opposite directions. More specifically, the CTLE 71 maintains the gain of the high frequency component of the strobe signal DQS and decreases the gain of the DC component of the strobe signal DQS in a case where the signal level of the first signal is lower than the threshold level.

The amplifier 72 uniformly controls the gain of the DC component of the output signal of the CTLE 71 and the gain of the high frequency component of the output signal of the CTLE 71, and compensates for the gain of the DC component controlled by the CTLE 71. For example, in a case where the signal level of the first signal is lower than the threshold level, the amplifier 72 uniformly raises the gain of the DC component of the output signal of the CTLE 71 and the gain of the high frequency component of the output signal of the CTLE 71, and increases the gain of the DC component by the amount lowered in the CTLE 71.

As illustrated in FIG. 6, the CTLE 71 includes NMOS transistors Q1 and Q2, current sources CS1 and CS2, resistors R1 and R2, variable resistor R3, and capacitors C1 to C3. The capacitors C1 and C2 are parasitic elements, and the capacitor C3 is a capacitor for determining a frequency characteristic.

The resistor R1, source and drain of the transistor Q1, and the current source CS1 are connected in series between a power supply voltage node VDD and a ground node. The resistor R2, source and drain of the transistor Q2, and the current source CS2 are connected in series between the power supply voltage node VDD and the ground node. The power supply voltage node VDD is a node to which a power supply potential of the NAND interface circuit 15 is applied, and the ground node is a node to which a ground (reference) potential of the NAND interface circuit 15 is applied. The capacitor C1 is connected between the drain of the transistor Q1 and the ground node. The capacitor C2 is connected between the drain of the transistor Q2 and the ground node. The variable resistor R3 and the capacitor C3 are connected in parallel between both sources of the transistors Q1 and Q2. An output of the comparator 44 is connected to a control terminal of the variable resistor R3. The variable resistor R3 changes a resistance value based on a signal input from the comparator 44 via the control terminal.

One signal inp of a differential signal is input to a gate of the transistor Q1, and the other signal inn of the differential signal is input to a gate of the transistor Q2. Here, the differential signal is the strobe signal DQS. A drain voltage Von of the transistor Q1 and a drain voltage Vop of the transistor Q2 are input to the amplifier 72.

When capacitances of the capacitors C1 to C3 are $C_d$, the resistance values of the resistors R1 and R2 are $R_d$, the resistance value of the variable resistor R3 is $R_s$, and transconductances of the transistors Q1 and Q2 are $g_m$, a DC gain $A_v$ of the CTLE 71 is expressed by Equation (1) below.

$$A_v = \frac{g_m R_d}{1 + \frac{g_m R_x}{2}} \quad (1)$$

The amplifier 72 includes NMOS transistors Q3 and Q4, a variable current source CS3 of which a current is variable, resistors R4 and R5, and capacitors C4 and C5. The capacitors C1 and C2 are parasitic elements. The transistors Q3 and Q4 form a differential pair, and the variable current source CS3 is connected between both sources of the transistors Q3 and Q4 and the ground node. The resistor R4 is connected between the power supply voltage node VDD and a drain of the transistor Q3. The resistor R5 is connected between the power supply voltage node VDD and a drain of the transistor Q4. The capacitor C4 is connected between the drain of the transistor Q3 and the ground node, and the capacitor C5 is connected between the drain of the transistor Q4 and the ground node. The output of the comparator 44 is connected to a control terminal of the variable current source CS3. The variable current source CS3 changes a flowing current value based on a signal from the comparator 44 input via the control terminal.

A voltage Vop is input to a gate of the transistor Q3, and a voltage Von is input to a gate of the transistor Q4. A drain voltage Voutp of the transistor Q4 and a drain voltage Voutn of the transistor Q3 are differential output signals of the amplifier 72.

When resistance values of the resistors R4 and R5 are $R_d$, transconductances of the transistors Q3 and Q4 are $g_m$, and drain currents of the transistors Q3 and Q4 are $I_d$, a DC gain $A_v$ of the amplifier 72 is expressed by Equation (2) below.

$$A_v = g_m R_d, \ g_m \propto \sqrt{I_d} \ldots \quad (2)$$

Figure 7A:
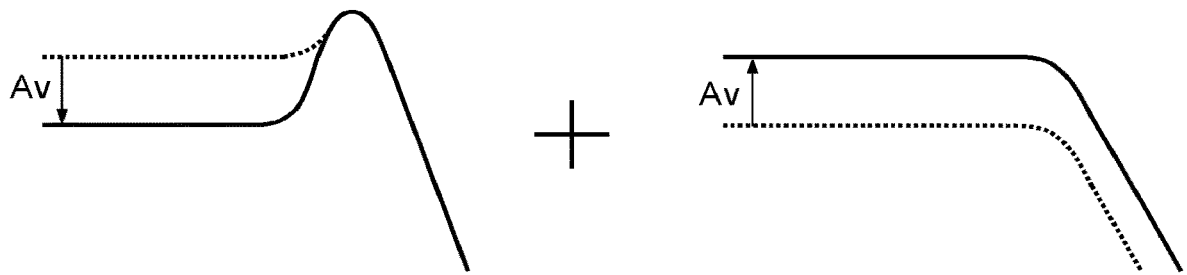
FIG. 7A is a diagram illustrating an example of frequency characteristics of a CTLE and an amplifier of a DQS receiver.
Figure 7B:
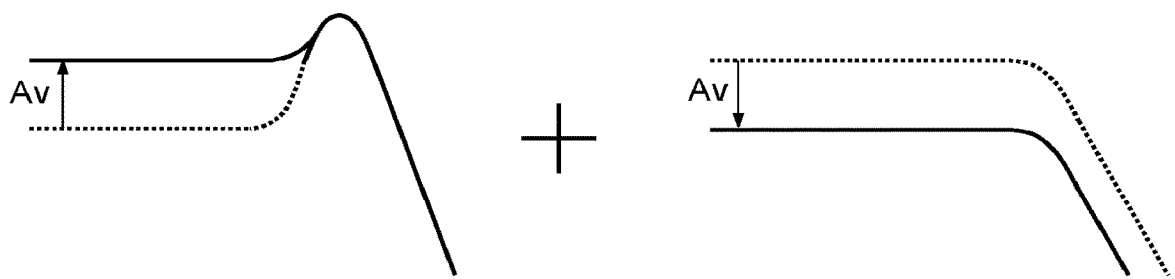
FIG. 7B is a diagram illustrating another example of frequency characteristics of a CTLE and an amplifier of a DQS receiver.

FIGS. 7A and 7B illustrate a frequency characteristic of the CTLE 71 included in the DQS receiver 42 and a frequency characteristic of the amplifier 72. The frequency characteristic of the CTLE 71 included in the DQS receiver 62 and the frequency characteristic of the amplifier 72 are also the same as those in FIGS. 7A and 7B.

FIG. 7A illustrates the frequency characteristics of the CTLE 71 and the amplifier 72 in a case where the comparator 44 of the DQS receiver 42 determines that there is not the strobe signal DQS, that is, in a case where signal amplitude of the first signal output from the low-pass filter 43 is smaller than VDD/4 (<VDD/4). When it is determined that there is not the strobe signal DQS, the control is performed to more increase a resistance value $R_s$ of the variable resistor R3 of the CTLE 71. As shown in Equation (1), as the resistance value $R_s$ of the variable resistor R3 is increased, a gain of the low frequency component including the DC component of the CTLE 71 (hereinafter, referred to as a DC gain) decreases, and a relative gain difference $A_v$ between the input and output DC gains of the CTLE 71 are further increased. Accordingly, the boost amount of the high frequency component of the strobe signal DQS is increased. In the amplifier 72, a current Is flowing through the variable current source CS3 is controlled to be increased. Accordingly, as shown in Equation (2), the amplifier 72 uniformly raises the gain of the DC component and the gain of the high frequency component. Therefore, when the CTLE 71 and the amplifier 72 are combined, the control to increase an AC gain is performed without changing the DC gain. As a result, in a case where it is determined that there is not the strobe signal DQS, the AC gain (boost amount) can be further increased without changing the DC gain when the CTLE 71 and the amplifier 72 are combined.

FIG. 7B illustrates the frequency characteristics of the CTLE 71 and the amplifier 72 in a case where the comparator 44 of the DQS receiver 42 determines that there is the strobe signal DQS. When it is determined that there is the strobe signal DQS, the control is performed to further decrease the resistance value $R_s$ of the variable resistor R3 of the CTLE 71. The smaller the resistance value $R_s$ of the variable resistor R3, the higher the DC gain of the CTLE 71, and the relative gain difference $A_v$ between the input and output DC gains of the CTLE 71 is further decreased. Accordingly, the boost amount of the high frequency component of the strobe signal DQS is decreased. In the amplifier 72, a current flowing through the variable current source CS3 is controlled to be decreased. Accordingly, in the amplifier 72, the gain of the DC component and the gain of the high frequency component can be suppressed to be low. As a result, in a case where it is determined that there is the strobe signal DQS, the AC gain (boost amount) can be further decreased without changing the DC gain when the CTLE 71 and the amplifier 72 are combined. As a result, current consumption of the DQS receiver 42 can be reduced.

FIG. 6 illustrates the internal configuration of the DQS receiver 42 of the controller 3, but a DBS receiver 62 of the NAND memory 2 can also have the same configuration as that of FIG. 6

As described above, in the second embodiment, in a case where the comparator 44 of the DQS receiver 42 determines that there is not the DQS, the resistance value $R_s$ of the variable resistor R3 of the CTLE 71 is increased to further decrease the DC gain of the CTLE 71, and the boost amount of the high frequency component is further increased, and the current flowing through the variable current source CS3 of the amplifier 72 of the subsequent stage is increased to compensate for the DC gain by the amount decreased in the CTLE 71. In a case where the comparator 44 determines that there is the DQS, the resistance value $R_s$ of the variable resistor R3 of the CTLE 71 is decreased so that the DC gain is not decreased in the CTLE 71. Accordingly, power consumption in the amplifier 72 of the subsequent stage can be reduced.

Third Embodiment

In the first and second embodiments, the threshold level compared with the first signal by the comparator 44 is set to a fixed value, but in the third embodiment, the threshold level is made variable and the boost amount of the high frequency component of the strobe signal DQS can be finely adjusted.

In the third embodiment, a NAND interface circuit 15a and a controller interface circuit 20a having a configuration different from that of the first and second embodiments is provided. The NAND interface circuit 15a and the controller interface circuit 20a include an AD converter (hereinafter, referred to as ADC) 50 including a plurality of the comparators 44.

Figure 8:
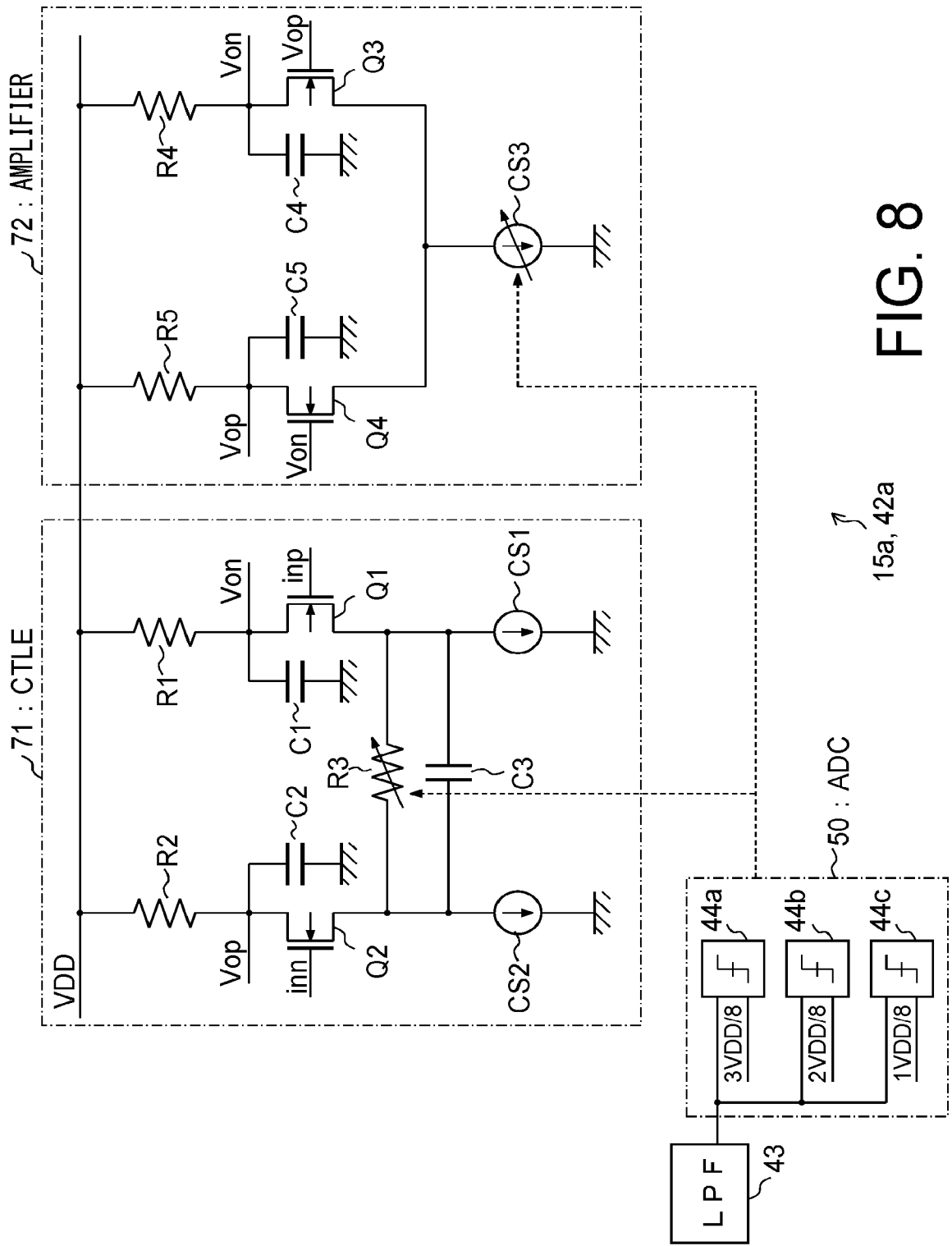
FIG. 8 is a circuit diagram illustrating an internal configuration of an ADC and a DQS receiver according to a third embodiment.

FIG. 8 is a circuit diagram illustrating an internal configuration of the ADC 50 and a DQS receiver 42a included in the NAND interface circuit 15a according to the third embodiment. The ADC 50 of FIG. 8 includes a plurality of the comparators 44 and outputs a multi-bit digital signal including a comparison result signal of a plurality of the comparators 44. FIG. 8 illustrates an example in which a different threshold level is set for each of three comparators 44 (hereinafter, referred to as a first comparator 44a, a second comparator 44b, and a third comparator 44c) included in the ADC 50. The number of the comparators 44 of the ADC 50 and the threshold level are arbitrary.

The first comparator 44a outputs a signal indicating whether or not the first signal output from the low-pass filter 43 is equal to or lower than 3 VDD/8, which is a first threshold level. The second comparator 44b outputs a signal indicating whether or not the first signal output from the low-pass filter 43 is equal to or lower than 2 VDD/8, which is a second threshold level. The third comparator 44c outputs a signal indicating whether or not the first signal output from the low-pass filter 43 is equal to or lower than 1 VDD/8, which is a third threshold level.

For example, in a case where the amplitude of the first signal is VDD/2, the ADC 50 outputs a digital signal (111) when the first signal output from the low-pass filter 43 is greater than 3 VDD/8. When the first signal is greater than 2 VDD/8 and equal to or less than 3 VDD/8, the ADC 50 outputs a digital signal (110). When the first signal is greater than 1 VDD/8 and equal to or less than 2 VDD/8, the ADC 50 outputs a digital signal (011). When the first signal is equal to or less than 1 VDD/8, the ADC 50 outputs a digital signal (000).

The CTLE 71 of the DQS receiver 42a controls the resistance value $R_s$ of the variable resistor R3 based on the digital signal output from the ADC 50. Similarly, the amplifier 72 of the DQS receiver 42a controls the current flowing through the variable current source CS3 of the amplifier 72 based on the digital signal output from the ADC 50.

FIG. 9 is a timing diagram of operations of the ADC 50 and the DQS receiver 42a which are illustrated in FIG. 8. FIG. 9 illustrates a waveform of the first signal LOUT output from the low-pass filter 43 and a waveform of the comparison result signal of the first to third comparators 44a, 44b, and 44c.

For example, before time t11, since the signal level of the first signal LOUT is equal to or lower than 1 VDD/8, the digital signal output from the ADC 50 is (000). In this state, since the signal level of the strobe signal DQS is very low, the DQS receiver 42a maximizes the boost amount of the high frequency component of the strobe signal DQS. Within the period of time t11 and time t12, since the signal level of the first signal LOUT is higher than 1 VDD/8, and equal to or lower than 2 VDD/8, the digital signal output from the ADC 50 is (100). Within this period, the DQS receiver 42a sets the boost amount of the high frequency component of the strobe signal DQS to the large extent smaller than the maximum. Within the period of time t12 and time t13, since the signal level of the first signal LOUT is higher than 2 VDD/8, and equal to or lower than 3 VDD/8, the digital signal output from the ADC 50 is (110). Within this period, the DQS receiver 42a sets the boost amount of the high frequency component of the strobe signal DQS to the middle extent smaller than the large extent. Within the period of time t13 and time t14, since the signal level of the first signal LOUT is higher than 3 VDD/8, the digital signal output from the ADC 50 is (111). Within this period, the DQS receiver 42a minimizes the boost amount of the high frequency component of the strobe signal DQS.

FIG. 8 illustrates the internal configuration of the DQS receiver 42a of a controller 3a, but a DBS receiver 62 of a NAND memory 2 can also have the same configuration as that of FIG. 8

As described above, in the third embodiment, the signal level of the DC component of the received strobe signal DQS is detected in a plurality of stages, and the boost amount of the high frequency component of the strobe signal DQS in the DQS receiver 42a is finely adjusted for each stage. Accordingly, the power consumption of the DQS receiver 42a can be optimized as compared with the first and second embodiments.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A semiconductor integrated circuit comprising:
a reception circuit configured to receive a strobe signal of which a logic is intermittently switched in synchronization with a data signal and change a boost amount of at least a high frequency component of the received strobe signal;
an output circuit configured to extract a low frequency component including at least a DC component of the strobe signal received by the reception circuit and to output a first signal; and
a comparison circuit configured to compare a signal level of the first signal with a threshold level,
wherein the reception circuit is configured to change the boost amount of at least the high frequency component of the strobe signal based on a comparison result obtained by the comparison circuit.

2. The semiconductor integrated circuit according to claim 1,
wherein the reception circuit is configured to maintain a gain of the DC component of the strobe signal and to adjust a gain of the high frequency component of the strobe signal based on the comparison result by the comparison circuit.

3. The semiconductor integrated circuit according to claim 1,
wherein the reception circuit is configured to make the boost amount of the high frequency component of the strobe signal until a period after the strobe signal starts to be received greater than the boost amount of the high frequency component of the strobe signal after the period.

4. The semiconductor integrated circuit according to claim 3,
wherein the period after the strobe signal starts to be received is a period during the comparison circuit determines that the signal level of the first signal is equal to or lower than the threshold level.

5. The semiconductor integrated circuit according to claim 1,
wherein the reception circuit is further configured to increase the boost amount of the high frequency component of the strobe signal, in a case where the signal level of the first signal is equal to or lower than the threshold level, as compared with a case where the signal level of the first signal is higher than the threshold level.

6. The semiconductor integrated circuit according to claim 1,
wherein the reception circuit comprises:
an equalizer circuit configured to control a gain of the high frequency component of the strobe signal and a gain of the DC component of the strobe signal in opposite directions; and
an amplifier configured to uniformly adjust a gain of a low frequency component of an output signal of the equalizer circuit and a gain of a high frequency component of the output signal of the equalizer circuit.

7. The semiconductor integrated circuit according to claim 6, wherein
the equalizer circuit comprises:
first and second transistors in which the differential strobe signal received by the reception circuit is input to respective gates; and
a variable resistor connected between both sources of the first and second transistors,
the amplifier comprises:
third and fourth transistors in which each of drain voltages of the first and second transistors is input to the respective gates; and
a variable current source connected to both sources of the third and fourth transistors, and
the comparison circuit is configured to control a resistance value of the variable resistor and an amount of a current flowing through the variable current source depending on whether or not the signal level of the first signal is equal to or lower than the threshold level.

8. The semiconductor integrated circuit according to claim 7,
wherein the comparison circuit is further configured to increase the resistance value of the variable resistor and increase the amount of the current flowing through the variable current source in a case where the signal level of the first signal is equal to or lower than the threshold level, and to decrease the resistance value of the variable resistor and decrease the amount of the current flowing through the variable current source in a case where the signal level of the first signal is higher than the threshold level.

9. The semiconductor integrated circuit according to claim 1,
wherein the comparison circuit is configured to detect the signal level of the first signal in a plurality of stages, and the reception circuit is configured to change the boost amount of the high frequency component of the strobe signal for each of a plurality of the stages.

10. The semiconductor integrated circuit according to claim 1, further comprising
an analog-to-digital converter configured to output, as a digital signal, comparison result signals of a plurality of the comparison circuits that compare a plurality of the threshold levels having different signal levels with the signal level of the first signal,
wherein the reception circuit is configured to change the boost amount of the high frequency component of the strobe signal in a stepwise manner based on the digital signal.

11. A memory system comprising:
a semiconductor storage device configured to include a memory cell array; and
a controller configured to control writing and reading of data with respect to the memory cell array, wherein at least one of the semiconductor storage device and the controller includes the semiconductor integrated circuit according to claim 1.

12. A semiconductor storage device comprising:
a memory cell array includes a plurality of memory cells; and
an interface circuit configured to receive data to be written to a memory cell among the plurality of the memory cells included in the memory cell array,
wherein the interface circuit comprises the semiconductor integrated circuit according to claim 1, and configured to receive, as a data signal, the data to be written, and to receive a strobe signal which is a signal synchronized with the data signal.

13. The semiconductor storage device according to claim 12, wherein the interface circuit comprises:
a third sub-reception circuit includes the semiconductor integrated circuit and configured to receive the strobe signal;
a fourth sub-reception circuit configured to receive the data signal; and
a sampler circuit configured to synchronize the data signal received by the fourth sub-reception circuit based on the strobe signal output from the third sub-reception circuit, wherein
the data signal synchronized by the sampler circuit is written to the memory cell array.

14. A reception device comprising:
a first sub-reception circuit includes a semiconductor integrated circuit and configured to receive a strobe signal;
a second sub-reception circuit configured to receive a data signal; and
a sampler circuit configured to synchronize the data signal received by the second sub-reception circuit based on the strobe signal output from the first sub-reception circuit,
wherein the semiconductor integrated circuit comprises:
a reception circuit configured to receive the strobe signal of which a logic is intermittently switched in synchronization with the data signal and change a boost amount of at least a high frequency component of the received strobe signal;
an output circuit configured to extract a low frequency component including at least a DC component of the strobe signal received by the reception circuit and to output a first signal; and
a comparison circuit configured to compare a signal level of the first signal with a threshold level, and wherein the reception circuit is configured to change the boost amount of at least the high frequency component of the strobe signal based on a comparison result obtained by the comparison circuit.

15. The reception device according to claim 14,
wherein the reception circuit is configured to maintain a gain of the DC component of the strobe signal and to adjust a gain of the high frequency component based on the comparison result by the comparison circuit.

16. The reception device according to claim 14,
wherein the reception circuit is configured to make the boost amount of the high frequency component of the strobe signal until a period after the strobe signal starts to be received, greater than the boost amount of the high frequency component after the period.

17. The reception device according to claim 14,
wherein the reception circuit is further configured to increase the boost amount of the high frequency component of the strobe signal, in a case where the signal level of the first signal is equal to or lower than the threshold level, as compared with a case where the signal level of the first signal is higher than the threshold level.

18. The reception device according to claim 14,
wherein the reception circuit comprises:
an equalizer circuit configured to control a gain of the high frequency component of the strobe signal and a gain of the DC component of the strobe signal in opposite directions; and
an amplifier configured to uniformly adjust a gain of a low frequency component of an output signal of the equalizer circuit and a gain of a high frequency component of the output signal of the equalizer circuit.

19. The reception device according to claim 14,
wherein the comparison circuit is configured to detect the signal level of the first signal in a plurality of stages, and
the reception circuit is configured to change the boost amount of the high frequency component of the strobe signal for each of a plurality of the stages.

20. The reception device according to claim 14, further comprising
an analog-to-digital converter configured to output, as a digital signal, comparison results signal of a plurality of the comparison circuits that compare a plurality of the threshold levels having different signal levels with the signal level of the first signal,
wherein the reception circuit is configured to change the boost amount of the high frequency component of the strobe signal in a stepwise manner based on the digital signal.

* * * * *